US 7,644,389 B2

(12) United States Patent
Hennig et al.

(10) Patent No.: US 7,644,389 B2
(45) Date of Patent: Jan. 5, 2010

(54) METHOD FOR PRODUCING A MASK FOR THE LITHOGRAPHIC PROJECTION OF A PATTERN ONTO A SUBSTRATE

(75) Inventors: Mario Hennig, Dresden (DE); Rainer Pforr, Weixdorf (DE); Gerd Unger, München (DE)

(73) Assignee: Qimonda AG, Munich (DE)

( * ) Notice: Subject to any disclaimer, the term of this patent is extended or adjusted under 35 U.S.C. 154(b) by 516 days.

(21) Appl. No.: 11/668,565

(22) Filed: Jan. 30, 2007

(65) Prior Publication Data
US 2007/0196744 A1    Aug. 23, 2007

(30) Foreign Application Priority Data
Jan. 30, 2006    (DE)    .................... 10 2006 004 230

(51) Int. Cl.
*G06F 17/50*    (2006.01)
*G03F 1/00*    (2006.01)
*G03C 5/00*    (2006.01)

(52) U.S. Cl. .............. 716/21; 716/19; 716/20; 430/5; 430/30; 430/394

(58) Field of Classification Search .............. 716/19, 716/20, 21; 430/5, 30, 394
See application file for complete search history.

(56) References Cited

U.S. PATENT DOCUMENTS 4,504,558 A * 3/1985 Bohlen et al. .................. 430/30
4,591,540 A * 5/1986 Bohlen et al. .................. 430/22
6,710,847 B1   3/2004 Irie
7,125,651 B2 * 10/2006 Hasegawa et al. ............ 430/311
7,211,372 B2 * 5/2007 Park et al ..................... 430/321
7,374,869 B2 * 5/2008 Kohler et al. ................ 430/394
7,425,396 B2 * 9/2008 Gruss et al. ................... 430/22
2004/0197677 A1 * 10/2004 Kohle et al. ..................... 430/5
2004/0202943 A1 * 10/2004 Dettmann et al. ............... 430/5
2007/0077526 A1 * 4/2007 Finders ........................ 430/322
2007/0128552 A1 * 6/2007 Sawada et al. ............... 430/311

FOREIGN PATENT DOCUMENTS

DE    10346561        4/2004
WO    2005008333 A2   1/2005
WO    2006133729 A1   12/2006

* cited by examiner

*Primary Examiner*—Helen Rossoshek
(74) *Attorney, Agent, or Firm*—Edell, Shapiro & Finnan, LLC

(57) ABSTRACT

A layout is decomposed into partial patterns. An intermediate mask is drawn for each of the partial patterns. The intermediate masks are used in a mask stepper or scanner progressively for projection again into a common pattern on a test mask. A line width distribution LB(x,y) is determined from the test mask or from a test wafer exposed using the mask, and is converted into a distribution of dose corrections. The transmission T(x,y) of the respective intermediate masks is adapted based upon the calculated dose correction. This can be achieved using additional optical elements which are assigned to the intermediate masks and have shading structure elements, or by laser-induced rear-side introduction of shading elements in the quartz substrate of the intermediate masks themselves.

16 Claims, 7 Drawing Sheets

METHOD FOR PRODUCING A MASK FOR THE LITHOGRAPHIC PROJECTION OF A PATTERN ONTO A SUBSTRATE

CROSS REFERENCE TO RELATED APPLICATIONS

This application claims priority under 35 U.S.C. §119 to Application No. DE 102006004230.1 filed on Jan. 30, 2006, entitled "Method for Producing a Mask for the Lithographic Projection of a Pattern onto a Substrate," the entire contents of which are hereby incorporated by reference.

FIELD OF THE INVENTION

The invention relates to a method for producing a mask for the lithographic projection of a pattern onto a substrate.

BACKGROUND

Integrated circuits are typically produced with the aid of lithographic process techniques. For a number of circuit planes to be produced on a substrate, a respective mask is produced and used to project the pattern of the plane into a photosensitive layer (resist) on the substrate. By way of example, a projection apparatus that demagnifies the structure elements of the pattern in a ratio of 4:1 or 5:1 is used.

The exposed structures in the resist are subsequently developed so that afterward, in an etching step, the developed structures can be transferred into an underlying layer in which, by way of example, electronic components such as transistors or diodes, doping regions, capacitors, interconnects, or their mutual insulations, etc., are to be formed on the basis of trenches in the layer.

Miniaturization in semiconductor technology has advanced continuously in the past 20 years. Physical limits are imposed on miniaturization by the limited resolution capability, in particular of the projection apparatuses used, with progress continuously being made.

For the quality, however, not only is the minimum width of structure elements that can be obtained on the substrate crucial, but it is also necessary to take account of the uniformity of elements of approximately identical size that are predefined in the layout after an imaging on the substrate. By virtue of a two-stage process—firstly formation of the structure elements on the mask and subsequently on the substrate (e.g. a semiconductor wafer)—the effects of nonuniformity can be intensified in a disadvantageous manner.

This applies particularly when working with line widths, i.e. widths of the structure elements formed, in the range close to the resolution limit of the projection apparatus for the imaging from the mask onto, e.g., a wafer. In the case of line widths on the mask close to the resolution limit of the optical system, a function which relates the line widths respectively resulting in the course of the imaging on the wafer to the initial line widths on the mask becomes nonlinear. Local fluctuations on the mask can therefore lead to considerable line width variations on the substrate. This is referred to as the so-called Mask Error Enhancement Factor (MEEF).

Conversely, variations of line widths of different structure elements that are already formed unintentionally on the mask from the outset in the range have a particularly considerable effect on distributions of the line widths (LB) that correspondingly result on the substrate. A very high degree of uniformity of the line widths (LB) on the mask made available is therefore required.

Currently available techniques for producing structure patterns on masks are based on electron beam writers. However, the latter no longer suffice for the future requirements made of line width uniformity, in the context of which line widths of 50 nm or less are to be obtained after projection on the substrate (semiconductor wafer).

In a manner similar to that in the course of the described structure transfer from the mask into a resist arranged on the substrate, the pattern on the mask is also produced lithographically. However, the pattern is drawn using a high-resolution beam, for instance an electron beam. Masks with less stringent requirements made of the resolution can also be drawn using the laser beam in the ultraviolet wavelength range (at 248 nm or 365 nm).

The patterns drawn in the resist on the mask are transferred into the underlying absorber layer in etching processes, usually by dry etching. In addition to effects that may be brought about by development processes, in particular etching processes for transferring the resist structure into the absorber on the mask are also considered as the cause of fluctuations of the line width. This holds true particularly at the edges and in the corners of the mask substrate which are subject to systematically deviating conditions in the etching process.

This further holds true for the production of photolithographic masks, but arises in a disadvantageous manner in particular in the production of EUV masks (EUV: extreme ultraviolet wavelength range in the range of from approximately 10 to 15 nm, used in the projection of the pattern onto the wafer). In the production of templates for the nano-imprinted technique, these variations of line width considerably restrict the usability of this technique.

One approach for avoiding these disadvantages involves performing a predistortion of the structure elements that is adapted over the region of the mask. This predistortion would have to be calculated in the layout, i.e. the pattern still present in an electronic format. The pattern would then be drawn on the mask with the predistorted layout. The predistortions compensate for the systematic variations of the line width across the region. However, the currently available solutions in terms of hardware and software technology permit this method only to a very limited extent. It would be necessary at any rate to effect renewed adaptation of the layout data after the production of a first reference mask and hence rewriting at the pattern generator, which would in turn result in increased costs since even the first reference mask would have to meet the stringent specifications.

SUMMARY

A method is provided for producing a mask for lithographic projection that makes it possible to form an increased uniformity of the line widths on the mask. The line width uniformity is increased on the substrate that is exposed with the pattern of a mask.

A method for producing a production mask for the lithographic projection of a pattern onto a product wafer comprises providing the pattern in an electronically stored format; decomposing the pattern stored in the electronic format into a number of partial patterns; producing a respective intermediate mask for each of the partial patterns in a mask writing device, which comprises a) forming structure elements representing the respective partial pattern on a front side of the corresponding intermediate mask, b) subsequently progressively projecting the intermediate masks for the composition of a common pattern onto a test mask in a first projection apparatus, c) determining a distribution of line widths LB(x, y) of the formed structure elements of the common pattern on the test mask and, in each case, comparing with predefined, nominal line widths for the determination of a distribution of deviations ΔLB(x,y) of the line widths, d) predefining a function that specifies the line width in dependence on the radiation dose used in the first projection apparatus, e) calculating a distribution of corrections for the radiation dose from the predefined function and the measured distribution of deviations ΔLB(x,y) of the line widths so as to compensate for the deviations ΔLB(x,y) in the case of a projection, f) determining the transmission (T) in each case at the location (x,y) of the structure elements on the intermediate mask from the determined distribution of the corrections for the radiation dose, g) forming further structure elements that locally differently reduce the transmission (T) in each case at the location (x,y) of the structure elements of the partial pattern on the front side of the intermediate mask, in a plane spaced apart from the front side of the intermediate mask, with a distribution dependent on the determined transmission (T) at the location (x,y) of the structure elements on the intermediate mask; providing the intermediate masks with the further structure elements arranged in the plane spaced apart from the front side of the intermediate masks in the first projection apparatus for exposure of the production mask; and progressively projecting the intermediate masks onto the production mask for the composition of the common pattern from the decomposed partial patterns on the production mask in the first projection apparatus.

The above and still further features and advantages will become apparent upon consideration of the following detailed description of specific embodiments thereof, particularly when taken in conjunction with the accompanying drawings wherein like reference numerals in the various figures are utilized to designate like components.

DETAILED DESCRIPTION

The terms intermediate mask, test mask, and production mask, as used herein, designate photomasks. The different terms serve for simplified differentiation of the masks from one another when implementing the methods described herein. The same applies to the terms test wafer and product wafer, which designate semiconductor wafers. However, other types of substrates such as, for example, LCD (liquid crystal displays), can also be produced with a production mask formed as described herein.

In order to further improve the uniformity of line widths, a multistage production process is provided. First, the pattern to be formed on the mask is made available as a layout. The layout is defined herein as a pattern which is stored in an electronic format and which reproduces the positions of structure elements of an integrated circuit plane to be produced with respect to a system of reference coordinates. Auxiliary structures, so-called SRAF structures (sub-resolution assist features) or biases (OPC bias, optical proximity correction) can also be established therein. The auxiliary structures are not directly imaged in the case of projection from a mask onto the substrate, but can influence the imaging of further structure elements.

The layout may also relate to phase masks, with the result that what is specified therein is which structure elements are phase-shifting and which are not, or which structure elements (areas of geometrical figures in the layout) are to be embodied as opaque, semitransparent or fully transparent.

The layout is decomposed into partial patterns. One configuration provides for performing the decomposition in such a way that chips contained in the pattern are not separated. After the decomposition, therefore, the partial patterns preferably comprise layout portions of complete chips. In methods in which chips are separated, problems would possibly arise in the course of alignment in the context of the projection—which will be described below—into a common pattern. The partial patterns may, of course, also comprise a plurality of chips.

The decomposition of the layout is achieved with the aid of conventional software. A series of software tools that can be used to carry out operations such as combination, separation, and rework (e.g. inclusion of biases), are conventionally available for this purpose.

It is also possible, as an alternative, to create the partial patterns separately from the outset, but it is expedient for the purpose of later quality controls such as defect inspection, positional accuracy measurement, etc. to have available an electronically stored overall pattern that serves as a reference for the corresponding measurements.

The partial patterns are drawn on, e.g., a scale enlarged by a factor X relative to the final mask structure in each case on intermediate masks which together produce a mask set. The overall pattern is thus distributed between a plurality of such intermediate masks.

Production is achieved in each case in a conventional mask writing device. The intermediate masks are subsequently transferred on the scale 1/X onto a resist-coated mask blank and in the process are composed in such a way that a test mask having the desired overall pattern for the imaging on the wafer arises after the conclusion of all the customary mask production processes. The imaging from the intermediate mask onto this common test mask can be carried out in a mask stepper or scanner.

Similar projection apparatuses for the imaging of a structure from a mask onto a wafer also have such devices a light source, an illumination optic and an objective lens system as well as illumination and exit pupils and a beam path with mask and image planes; there is no intention here to effect restriction to wavelength ranges for the projection onto the mask.

In one embodiment, a line width distribution is determined on the test mask. The exposure of a wafer is effected only by a final production mask that is yet to be produced.

The structure elements formed on the test mask are measured over the mask surface with regard to their line widths. The deviation of the measured line widths from a respective target value is further calculated. The target value emerges as a predefinition for the respective structure element from the electronically stored pattern, i.e., the layout.

A function is predefined. The function describes a dependence of the line width formed on the test mask on the radiation dose used during the projection from the intermediate masks. On the basis of the function, a correction value for the local radiation dose can be calculated for each structure element to be imaged or each position on the test or intermediate masks. The calculation is performed such that the correction of the local dose after application to the relevant structure element on the mask during production, leads to a desired line width (target line width) on the test mask.

It is possible to calculate a difference matrix having the difference between the desired target line widths and the line width distribution that is actually present. The term "matrix", as used herein, denotes a representation of the distribution over the active region of the masks or over the layout. For points of an imaginary grid, the corresponding values of the distribution are specified as entries in the matrix.

A dose correction matrix or a transmission matrix can then be calculated from such a difference matrix using the function of the line width in dependence on the radiation dose. The transmission matrix specifies, for corresponding points in the layout or on the test mask, the values for the transmission which are used to carry out a correction of the intensity of the light radiated onto the test mask during projection. The dose correction is therefore effected by a local adaptation of the intensity or of the transmission on the test mask—or in close proximity of the location of the structure elements on the test mask in the projection apparatus.

According to the layout that has been decomposed into partial patterns, transmission distributions are determined on the basis of the transmission matrix, which specifies the local values of the transmission, for each of the intermediate masks of the set initially produced.

For the adaptation of the transmission in accordance with the entries in the calculated transmission matrix, according to exemplary embodiments, optical elements similar to quartz pellicles can be added to the intermediate masks, or, in accordance with further examples, the glass substrate of the intermediate masks is processed on the rear side, with the result that the corresponding absorption is produced in the glass carrier of the mask itself. These examples are explained in more detail below.

The effect is that the mask substrates or the optical components assigned thereto are locally adapted in terms of their transmission properties by means of patterning. In this case, the absorbent structure elements are situated at the defocus on the object side. This is because they are sufficiently spaced apart from the structure elements of the pattern on the mask front side (of the intermediate masks). Consequently, this spacing apart gives rise to a smearing out of the adaptation of the transmission in the focal plane of the intermediate mask. On account of this, it is not necessary to realize transmission values that are different in a complicated fashion—for instance by absorption layers having different thicknesses. Rather, the degree of transmission can be set by the density of discrete absorbent elements on the optical component or in the glass carrier on the mask rear side.

The use of such transmission-controlled optical components permits a flexible adaptation of the structure geometries caused by the projection of the intermediate masks on the mask produced for the actual production of wafers, also referred to herein as a "final" production mask. The production mask is produced as already in the case of the production of the test mask by the intermediate masks in the projection apparatus, which may be a mask stepper or scanner.

The production mask is transmission-controlled in contrast to the test mask. One advantage arises when using optical components for the adaptation of the transmission in that the intermediate masks themselves can be reused later. Only the optical components have to be produced anew in each case. As a final step, a product wafer is exposed by means of the production mask produced.

If the process for producing the integrated circuit is changed and the line width distribution on the test mask changes as a consequence, then it is merely necessary to determine this distribution and to produce a new optical component in dependence thereon. In this case, the old production mask is replaced by a new production mask which is produced from the intermediate masks that have adapted anew according to the method described herein.

In a second embodiment, the pattern in the projection apparatus can also be transferred further from the test mask onto a test wafer in order to be measured there with regard to the determination of a line width distribution of structure elements.

The structure elements formed on the test wafer are measured over the image field with regard to their line widths. The deviation of the measured line widths from a respective target value is further calculated. The target value emerges, as explained above, as a predefinition for the respective structure element from the electronically stored pattern, i.e., the layout. Analogously to the first aspect, a difference matrix can be determined from the deviation in each case between measured and predefined line widths on the test wafer.

A correction function is furthermore predefined, which takes account of the effects of the mask error enhancement factor (MEEF), as described above, during the imaging from the test mask onto the test wafer in the wafer stepper or scanner. The MEEF describes the dependence of the line width that results on the test wafer as a function of the line width on the test mask. The correction function is applied to the entries in the difference matrix. The further steps from the determination of the transmission matrix through to the projection of the pattern from the production mask onto a product wafer are carried out in a similar manner as described above in the first embodiment.

Therefore, in the first embodiment, the transmission is controlled on the basis of the line width deviations on the test mask, whereas in the second embodiment, it is controlled on the basis of the corresponding distribution of structure elements on the test wafer.

Minor proximity effects that occur during the transfer of the intermediate masks can also be corrected in accordance with the methods described herein.

Exemplary embodiments of the invention are now described with reference to the figures.

Figure 1:
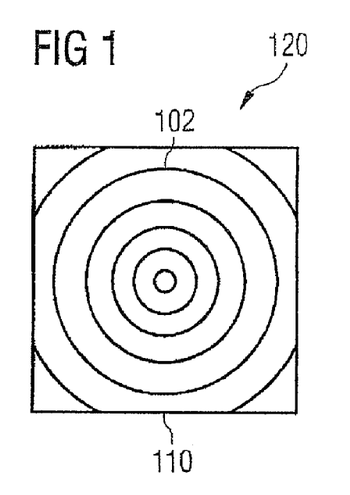
FIG. 1 shows a typical distribution of line widths on a mask after an etching process.

FIG. 1 shows a schematic illustration of the distribution 120 of line widths on a mask 110. The contour lines 102 specify points of identical line width (so-called Iso-CD lines, CD: critical dimension) for an exemplary, specifically chosen structure geometry. A center-edge variation can clearly be discerned. The distribution represents a typical signature after a dry etching process has been carried out on the mask 110, a pattern being transferred from the exposed resist into an underlying layer by a dry etching process.

The line width distribution shown leads to comparable or, on account of the MEEF, even intensified line width variations in the image field of a scanner on a wafer if the latter is exposed with the pattern of the mask 110. Significantly smaller line widths occur at the edge, but in particular in the corners, of the image field than the center thereof. This is caused primarily by nonuniformities of the etching process with regard to the absorber layer over the mask, which may be brought about by local variations of the etching plasma.

Figure 2:
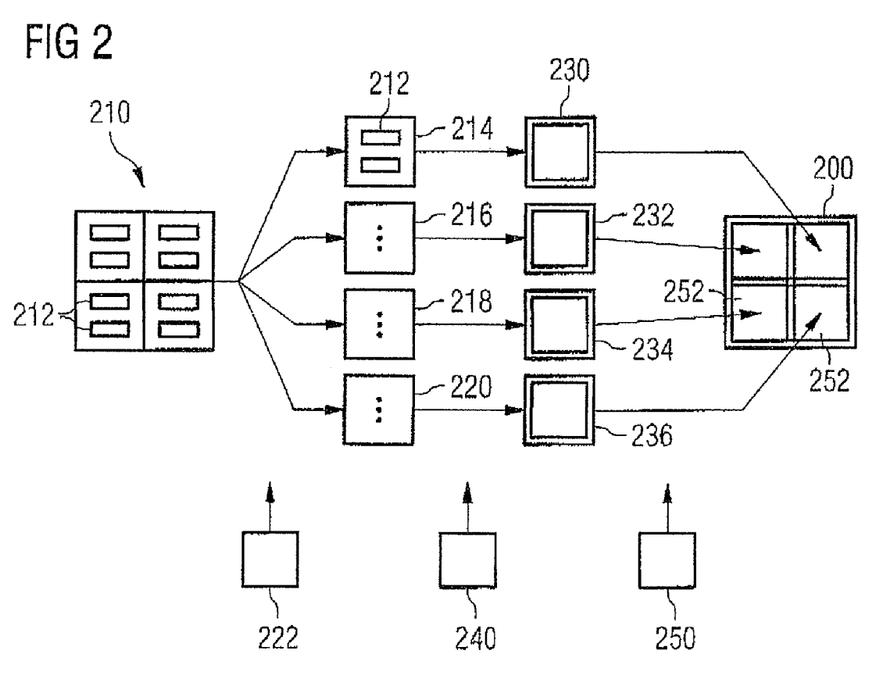
FIGS. 2-8 illustrate method steps for producing a mask in accordance with first and second exemplary embodiments.

FIG. 2 shows, in a first exemplary embodiment, a first part of a method up to the production of the reference projection mask 200. An initial layout 210 of an arrangement of chips 212 for producing DRAM (dynamic random access memory) memory components is provided as an electronically stored file (or compilation of a plurality of files) in the GDS-II format, by way of example, in a computing system 222 (computer).

The layout comprises 2×4 chips 212. On the basis of suitable software executed on the computing system 222, the layout 210 is separated into four partial layouts or partial patterns 214-220. Each partial pattern comprises two of the chips 212 of DRAM components. It should be noted that this exemplary embodiment is reproduced in simplified fashion here. Thus, provision can be made for also establishing barcodes or product identifications and also alignment and measurement structures in regions outside the chips (Kerf).

If, by way of example, a dimension of 40 nm is desired as the target size of a structure element in the chip, then the production of a test mask 200 with a structure element having a dimension of 160 nm is realized. The mask—wafer imaging scale is 4:1 in this example. A scale of 2:1 is provided for the imaging from the intermediate masks 230-236 onto the test or production masks 200, 600. The relevant structure element is consequently produced with an enlarged dimension of 0.32 μm on an intermediate mask 230-236 provided in the process.

The four intermediate masks 230-236 are produced in a mask writer 240 (also referred to as a pattern generator, or PG). Considerable costs and production time can be saved using this method, because high-end devices do not necessarily need to be used for this purpose.

The four intermediate masks 230-236 are supplied to a mask stepper or scanner 250. In the mask stepper or scanner 250, the masks are progressively projected into corresponding exposure fields 252 alongside one another on a mask blank coated with photosensitive resist. The exposed mask blank is formed into the test mask 200 by further processing (development, etching, resist stripping).

Figure 3:
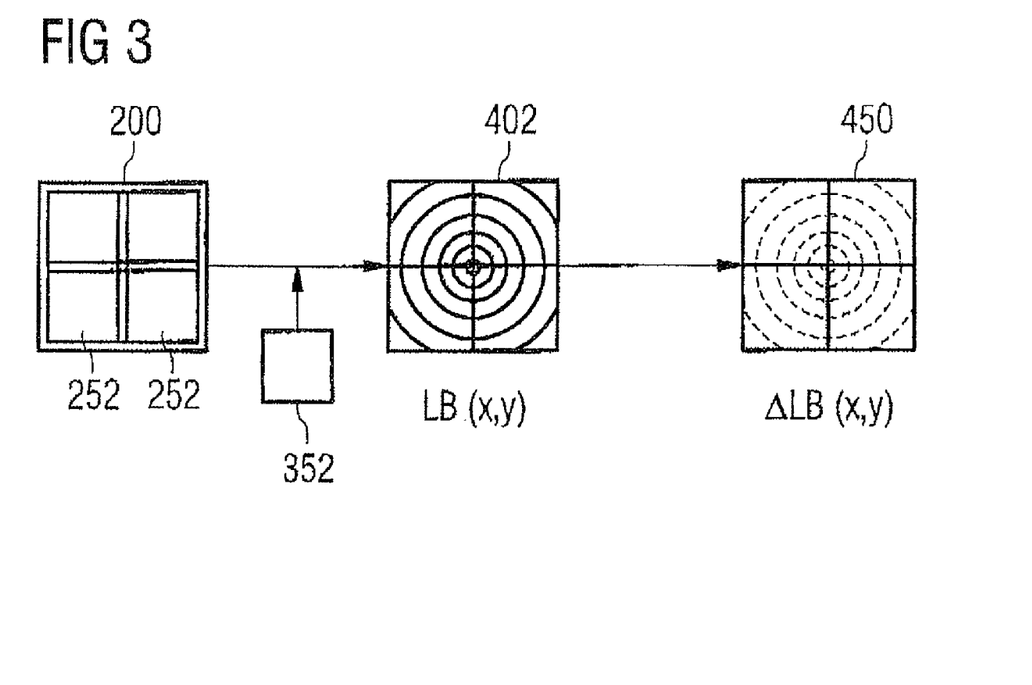

FIG. 3 shows further method steps, in which transmission corrections are calculated on the basis of the test mask 200 itself. A metrology measuring device 352, for instance an SEM (scanning electron microscope), an arbitrary optical microscope, or an AFM (atomic force microscope), designed for examining masks, is used for the local measurement of line widths (LB) of a multiplicity of structure elements at positions (x,y) on the test mask 200. From the distribution 402 of line widths LB(x,y) on the test mask 200 determined in this way, a matrix 450, i.e. $\Delta LB(x,y)$, is calculated by comparison with predefined target values for the width of the structure elements.

Figure 4:
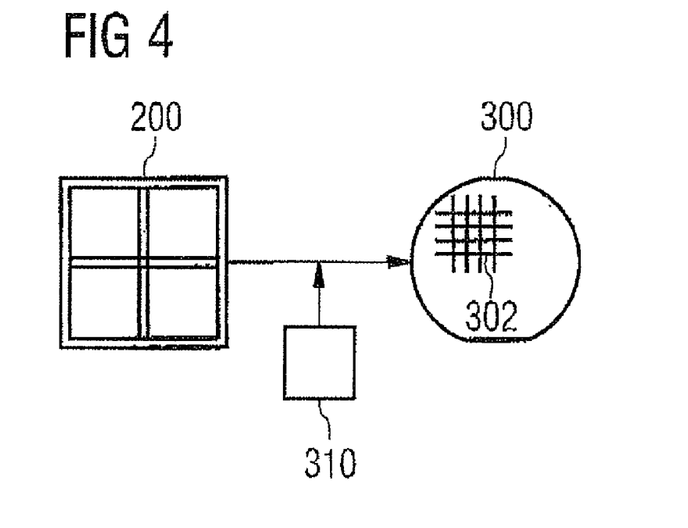
Figure 5:
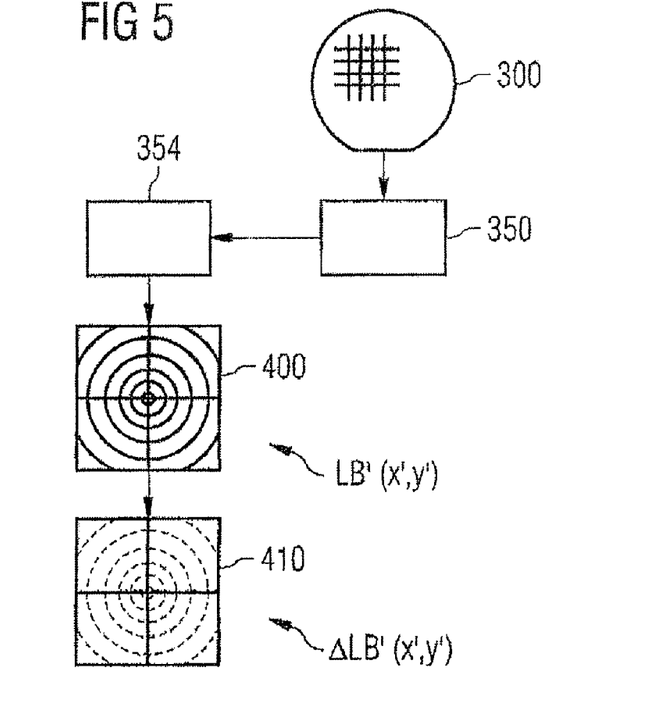
Figure 6:
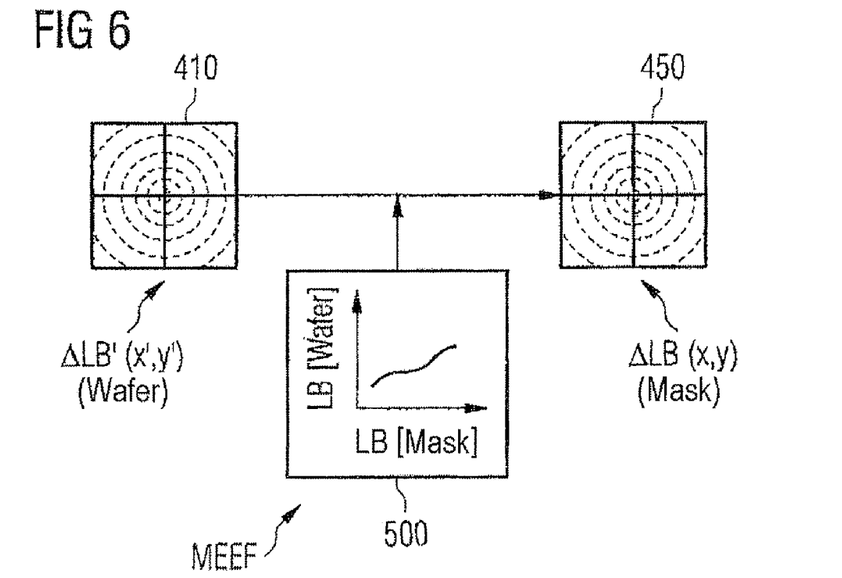

FIGS. 4-6 show, as an alternative to the procedure according to FIG. 3, a refinement in accordance with a second embodiment. This involves determining the later transmission corrections for the intermediate masks on the basis of measurement results of a test wafer 300 that is exposed with the aid of the test mask 200.

FIG. 4 shows the step of projection of the pattern from the test mask 200 into exposure fields 302 on the test wafer 300. The projection is carried out in a projection apparatus 310, for instance a wafer stepper or scanner.

FIG. 5 shows the further sequence of the measurement. The wafer 300 is supplied to a metrology measuring device 350, in which line widths LB' are measured at a multiplicity of positions (x',y') on the wafer 300. The positions (x',y') relate to one of the exposure fields 302 and can thereby be transferred to coordinates in the reference system of the mask.

A further computer 354 is connected to the metrology device 350, and is used to determine a line width distribution 400 or LB'(x',y') over the imaged region of the mask from the measurement results. This is followed by determining the difference with respect to an average line width LB, or with respect to a line width LB predefined in some other way, which can be determined from the layout for the structure elements considered (target line width). The result is a difference matrix $\Delta LB'(x',y')$ describing the line width fluctuation 410 over the image field on the test wafer 300.

FIG. 6 shows the conversion of the fluctuation 410 calculated for the test wafer 300 into a line width correction matrix 450, which is applicable at the level of the masks. For this purpose, a function 500 is predefined, which takes account of the line width resulting during the projection on the wafer in dependence on the line width on the mask, that is to say compensates for influences of the MEEF value of the relevant structure during the imaging in the wafer scanner or stepper. The line width correction matrix 450, i.e. $\Delta LB(x,y)$, is calculated by the function.

Figure 7:
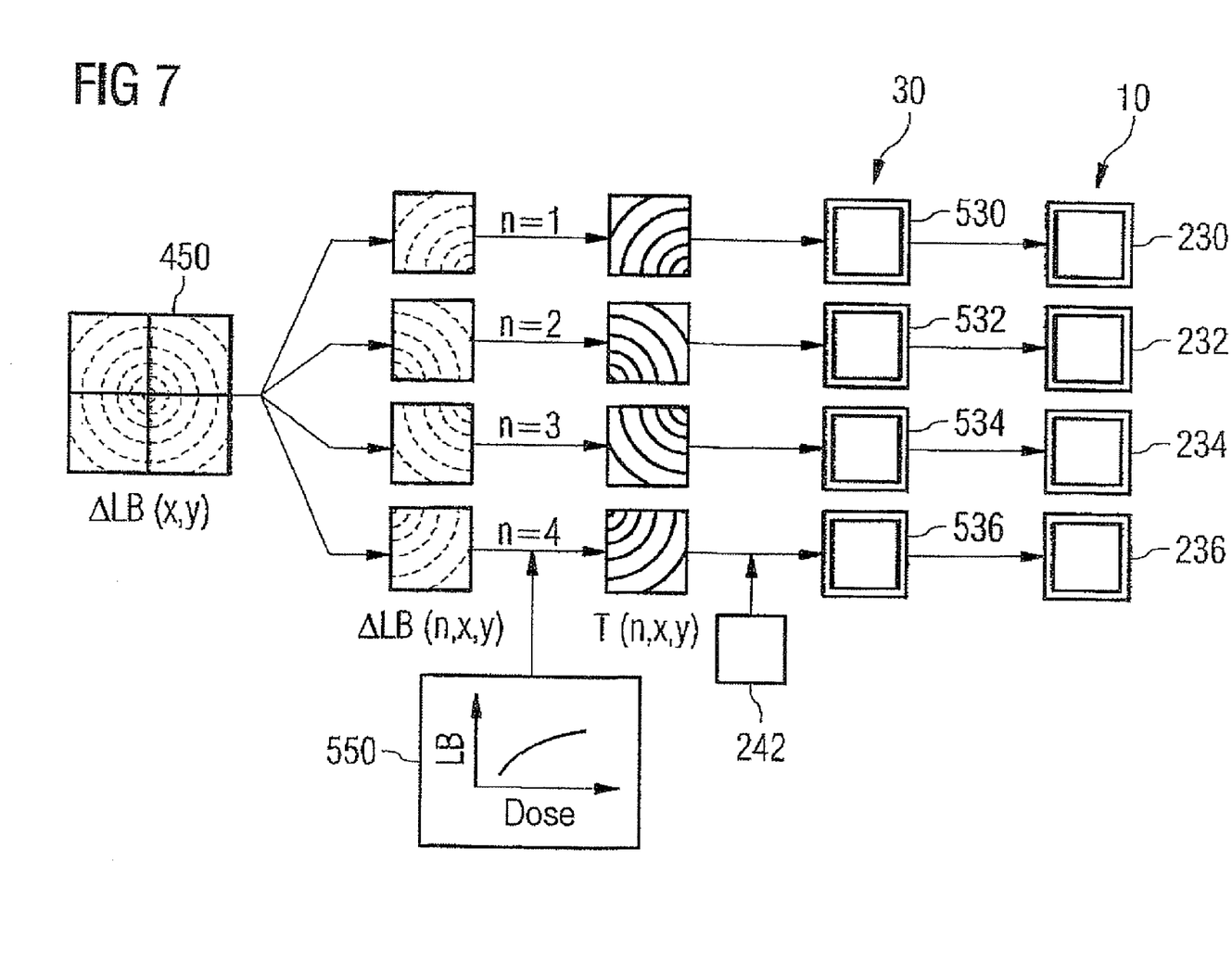

FIG. 7 shows the further sequence of the methods described above. The matrix 450 is first decomposed into parts (n) assigned to the individual intermediate masks 230-236 or the partial patterns formed therein. The coordinates (n,x,y) specify the position in the (n) partial patterns 214-220.

FIG. 7 further shows the production of optical elements 530-536 which are used to obtain the corrections of the line widths during the later projection. Transmission correction matrices T(n,x,y) are determined with predefinition and use of a function 550 for the variation of the line widths LB in dependence on the dose for the imaging of the structures from the intermediate mask 230-236 onto the test mask 200. The function is characteristic of the patterning process, that is to say in particular of a projection system (in the mask scanner or mask stepper) and of the resist process.

The locally required line width correction is obtained by a local adaptation of the transmission. In this exemplary embodiment, the adaptation is obtained by optical elements which are similar to quartz pellicles and which can be patterned in a mask writer 242, for instance a laser writer. The production process is similar to that of a chromium- or MoSi-coated mask. Examples of optical elements are shown in FIGS. 9-14 and also described in International Patent Application PCT/EP2005/006560, which is incorporated herein by reference in its entirety. In International Patent Application PCT/EP2005/006560, individual configurations of optical elements which can be used to locally influence and control the transmission of a mask assigned thereto are described in detail.

Figure 9:
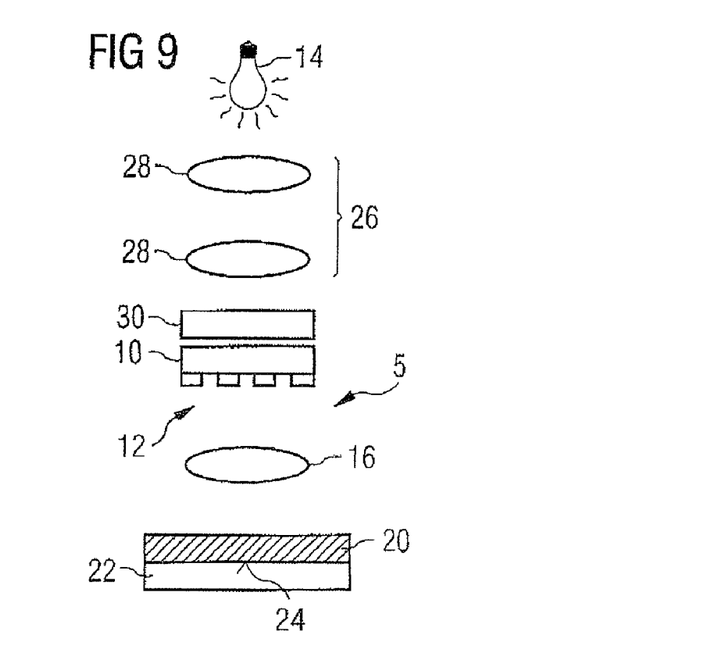
FIGS. 9-14 show examples for the use of optical elements which are assigned to the intermediate masks in order to influence the transmission properties thereof.

FIG. 9 shows an exemplary construction of an exposure arrangement in a projection apparatus 5 using additional optical elements 30. In this example, the projection apparatus 5 is a mask stepper or mask scanner. A light source 26 emits light having a wavelength of, for example, 193 nm (excimer laser). An illumination optic 26 comprises a number of lenses 28, so that a mask 10 situated in the beam path, the mask here being one of the intermediate masks 230-236, is transilluminated with a coherent beam bundle A pattern 12 is formed on the intermediate mask 10. It corresponds to one of the partial patterns 214-220. The light-attenuating or -absorbing structure elements of the pattern 12 may be embodied as chromium or MoSi ridges, quartz ridges or trenches or in any other manner desired in or on a quartz substrate of the mask.

The beam bundle structured by the structure elements passes through an objective lens system 16, with the result that it is focused onto the surface 24 of a mask 22 arranged in the image plane. The pattern is demagnified in the ratio 2:1 in this case. The mask 22 may correspond to the test mask 200 and also to the final production mask 600. Arranged on the surface is a light-sensitive resist layer that can be developed, with the result that the pattern transferred by projection can be transferred into an underlying layer, for example in a dry etching process.

Figure 8:
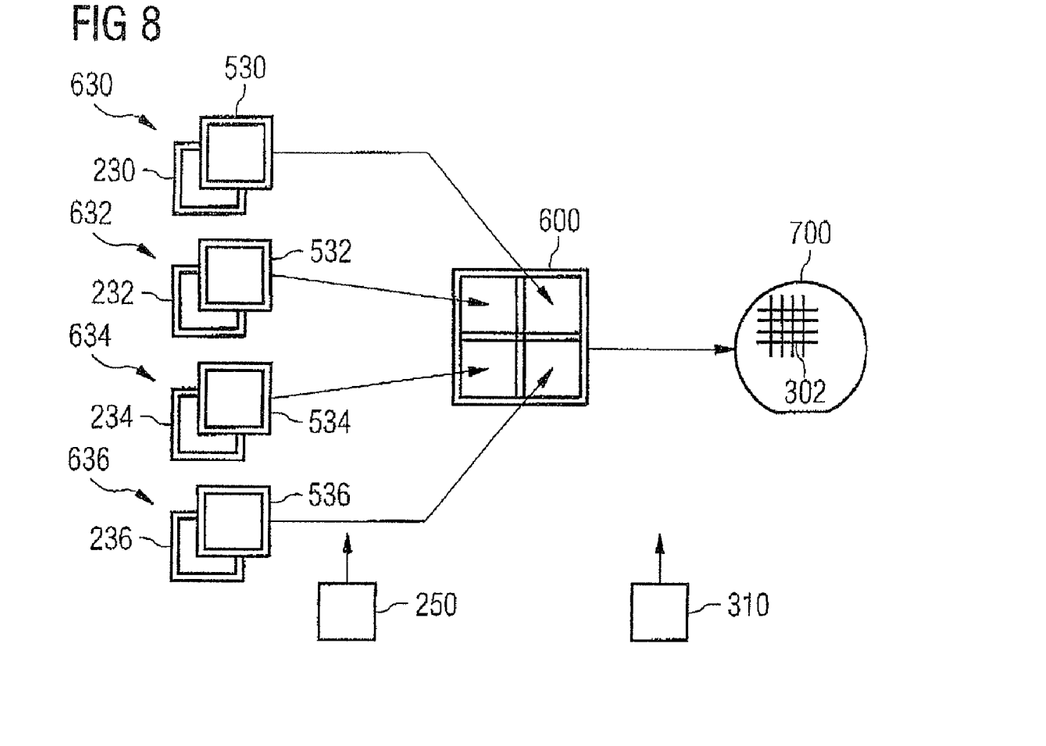
Figure 10:
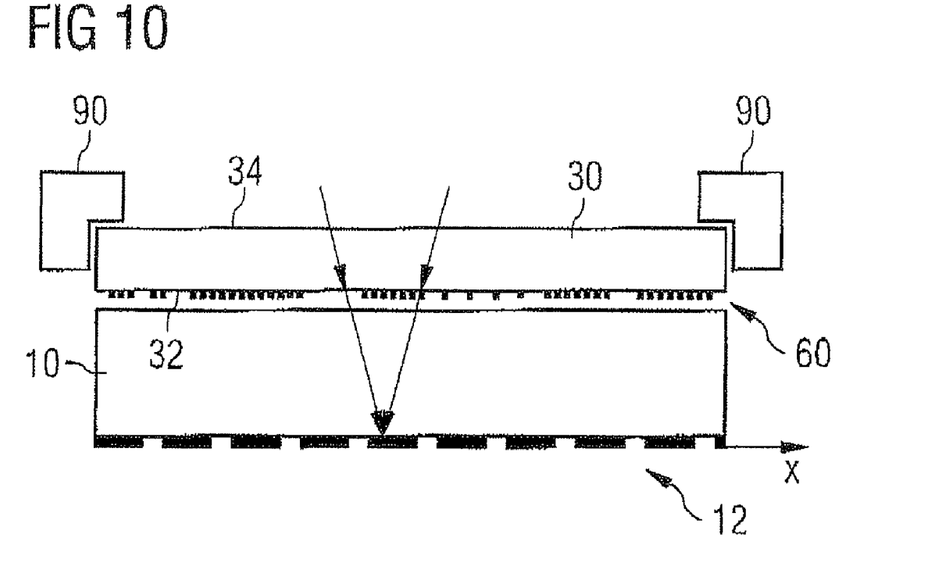

FIG. 10 shows the pair composed of mask 10 and optical element 30 in an enlarged illustration. The optical element may be the elements 530-536 which are shown in FIGS. 7 and 8 and have been produced by transmission matrices. The optical element 30 has a front side 32 and a rear side 34. The front side 32 of the optical element faces the rear side of the mask 10. A mount 90 composed of metal, for example, is affixed to the optical element 30 via adhesive bonding.

The optical element 30 may also be connected to the mask 10 on the front side by the mount 90 also being fixed to the mask 10 by adhesive bonding, by way of example. A gastight termination as in the case of a rear-side pellicle on the mask 10 is thereby realized.

Light-shading or -attenuating elements 60 composed of e.g. chromium or MoSi (molybdenum silicide) are formed on the front side 32 of the optical element 30. The density of the elements 60 corresponds to a correction function which is intended to be used to locally influence the intensity of the light incidence on the mask 10.

As an alternative, the elements 60 may also be implemented as a phase grating, i.e. as depressions etched in the transparent substrate of the optical element 30. In this case, the local grating constant of the phase grating determines on the basis of diffraction whether light contributions can be supplied at this position or whether the light emerges out of the beam path of the lens system, for example, in the event of excessively great diffraction.

A further alternative provides for locally disturbing the structure of the quartz substrate of the optical element 30 by a pulsed laser in order to form light-scattering elements 60.

Figure 11:
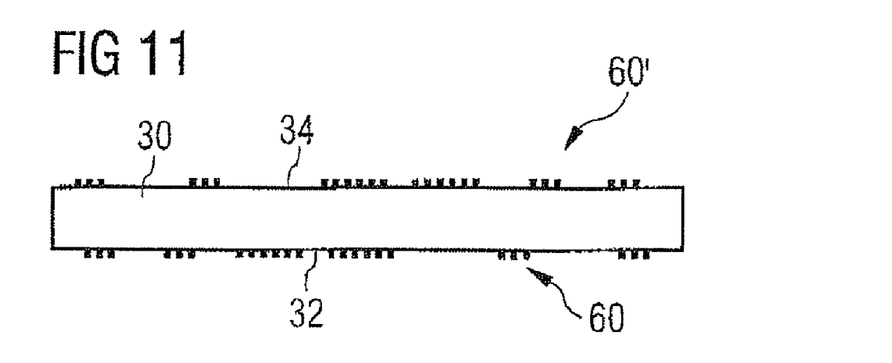

As is shown in FIG. 11, besides elements 60 applied on the front side 32, it is also possible to form further elements 60' on the rear side 34 of the optical element 30.

Figure 12:
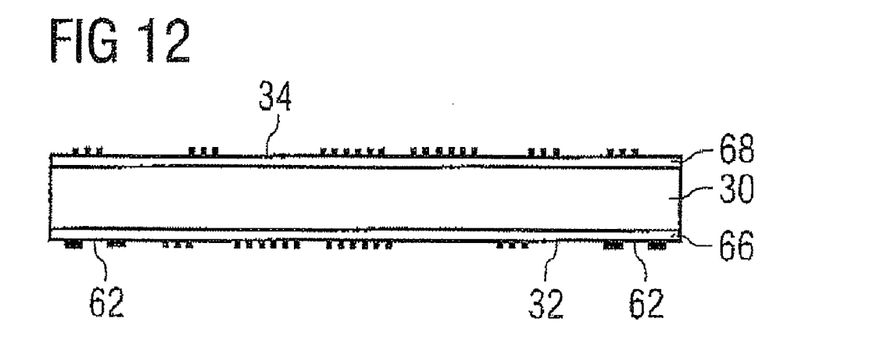

FIG. 12 shows that antireflection layers 66, 68 may furthermore be predefined on the front and/or rear side on the optical element 30 in order to prevent undesirable light reflections.

FIG. 10 illustrates for these examples how the elements 60 that absorb or at least attenuate light in discrete fashion bring about a continuous distribution of the transmission. The focal plane at the location of the mask is identified by a line X, that is to say that the elements 60 lie at the defocus and lead to an intentionally unsharp attenuation of the local intensity, i.e. the local transmission of the pair composed of mask 12 and optical element 30. The distance between the elements 60 and the ideal focal plane of the mask may be 1 to 8 mm, by way of example.

Figure 13:
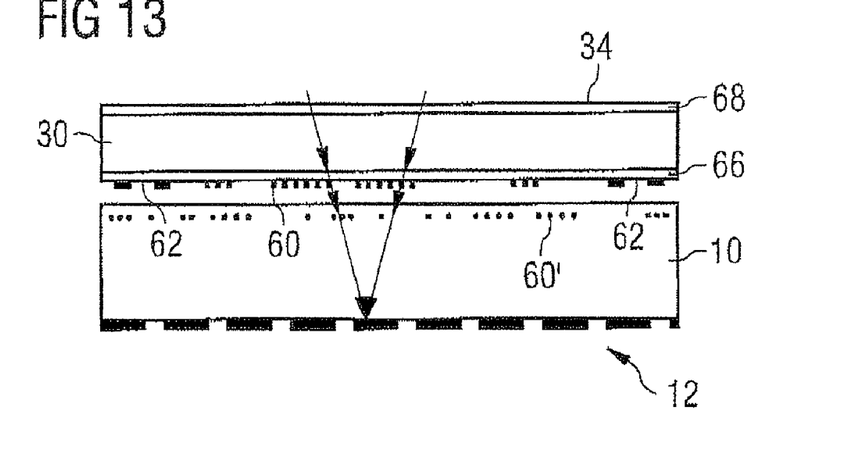

FIG. 13 shows an example in which, by alignment marks 62 on the optical element 30, it is ensured that the optical element is oriented correctly relative to the mask 12 (no rotations through 90, 180 or 270 degrees), but that the local positioning of elements 60 with respect to the structure elements of the pattern 12 also has a high accuracy.

Figure 14:
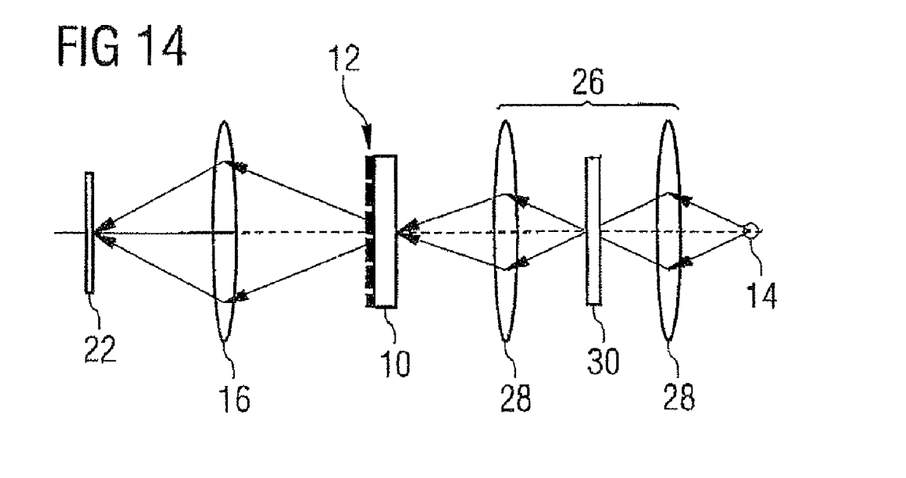

FIG. 14 shows an alternative embodiment, in which the optical element 30 is not arranged directly at the mask 12. Rather, it assumes a position lying directly adjacent to a further focal plane conjugate with the mask focal plane. The distance from the further plane may e.g. also again be 1 to 8 mm.

Figure 15:
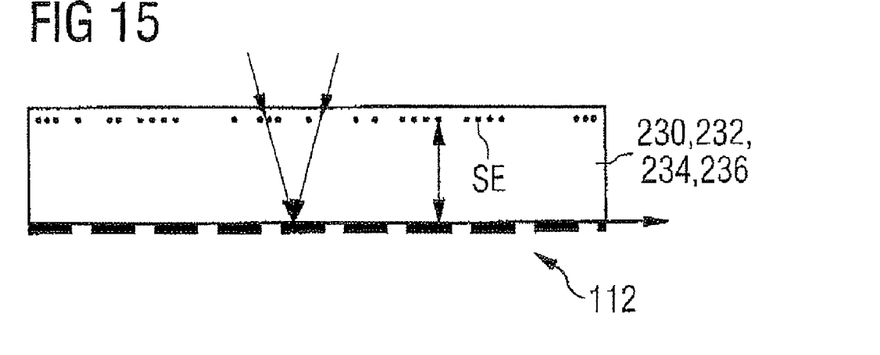
FIG. 15 shows an example for the formation of shading elements SE in the quartz substrate on the rear side of an intermediate mask for adaptation of the transmission.

As an alternative, as shown in FIG. 15, it is also possible to treat each of the intermediate masks in the glass substrate on the rear side with a laser for the formation of shading elements SE. The separately embodied optical elements shown in FIG. 8 are then not absolutely necessary. The front side is characterized by structure elements 112 which are formed from chromium, for example, and compose the pattern or the partial patterns 214-220. In these cases, the transmission matrix T(n,x,y) is written by a laser stepper using a femto laser. The arrows in FIG. 15 indicate that the plane of the shading elements SE is situated at the defocus. The density of the elements SE is a measure of the transmission to be obtained in the plane of the structure element 112.

Returning to the exemplary method sequence, FIG. 8 shows an assignment of the optical elements 530, 532, 534, 536 respectively to one of the corresponding intermediate masks 230, 232, 234, 236. In exposure steps, the resulting four pairs 630-636 composed of mask and assigned optical element are projected onto a further test mask (not shown) or a final production mask 600. The resist that is arranged and exposed is developed in accordance with conventional processing. In a dry etching process, the resist mask formed is transferred into an underlying transparent or semitransparent layer or, in the case of alternating or chromeless phase masks, if appropriate, also into the transparent quartz substrate of the mask.

In the case where the resulting four pairs 630-636 composed of mask and assigned optical element are projected onto a further test mask, it is possible to effect a renewed determination of the distribution of the line widths LB(x,y) on the further test mask and also to calculate the matrix $\Delta LB(x,y)$ by comparison with the predefined target values for the width of the structure elements. The values of the matrix $\Delta LB(x,y)$ can then be compared with predetermined maximum values $\Delta LB_{max}(x,y)$ for the respective deviation $\Delta LB(x,y)$. In the case where one of the deviations $\Delta LB(x,y)$ is greater than the associated value $\Delta LB_{max}(X,y)$, then the steps of the method as are described proceeding from the situation illustrated in FIG. 7 can be repeated. The loop described thereby can be repeated as often as desired until the individual values of the matrix are less than the corresponding maximum values $\Delta LB_{max}(x,y)$.

On the basis of the final production mask, product wafers 700 having increased uniformity of the line widths and hence improved quality can now be produced in volume production.

It is also possible, however, to measure a first one of the product wafers in a manner similar to a test wafer and, in the event of the uniformity of the distribution of line widths not yet being satisfactory, to repeat the steps of the method as are described proceeding from the embodiment illustrated in FIG. 5. The loop can be repeated as often as desired—until a predetermined value for the uniformity, e.g. a 3-sigma value of less than 2 nm given target line widths of 50 nm, is achieved.

This additional loop is advantageous particularly when, in the first pass of the method, the line widths fluctuated only on the basis of the test mask and not on the basis of the test wafer.

While the above description references specific exemplary embodiments, it will be apparent to one skilled in the art that various changes and modifications can be made to such embodiments without departing from the spirit and scope thereof. Accordingly, it is intended that the present invention covers such modifications and variations provided they come within the scope of the appended claims and their equivalents.

LIST OF REFERENCE SIGNS

10 Mask, intermediate mask
12 Pattern on mask with structure elements
14 Light source
16 Objective lens system
20 Resist on production mask
22 Substrate of the production mask
24 Surface of the substrate
26 Illumination optic
28 Lenses
30 Optical element 32 Front side
34 Rear side
60 Structure elements
62 Alignment mark
66, 68 Antireflection layer
90 Mount for optical element
SE Shading element, defect in the quartz substrate
102 Contour lines
110 Mask
120 Distribution of line widths after an etching
200 Test mask
210 Pattern in electronic format, layout
212 Chips
214, 216, 218, 220 Decomposed partial patterns
222 Computer
230, 232, 234, 236, 238 Intermediate masks
240 Mask writer
250 Mask stepper or scanner
252 Partial regions
300 Wafer
302 Exposure field
310 Wafer stepper or scanner
350 Metrology measuring device (for wafer)
352 Metrology measuring device (for mask)
354 Computer
400 Line width distribution (wafer)
402 Line width distribution (mask)
410 Deviations of the line widths from nominal or target value (relative to wafer)
450 Deviations of the line widths from nominal or target value (relative to mask)
500 Function (MEEF)
530, 532, 534, 536 Optical elements
550 Function (line width vs. radiation dose in the mask stepper or scanner)
600 Production mask
630, 632, 634, 636 Mutually assigned pairs composed of optical element and intermediate mask
700 Product wafer

What is claimed is:

1. A method for producing a production mask for the lithographic projection of a pattern onto a product wafer, the method comprising:
   a) providing the pattern in an electronically stored format;
   b) decomposing the pattern stored in the electronic format into a number of partial patterns;
   c) producing a respective intermediate mask for each of the partial patterns in a mask writing device, wherein the producing of the respective intermediate masks further comprises:
      (c.1) forming structure elements representing the respective partial pattern on a front side of each corresponding intermediate mask;
      (c.2) progressively projecting the intermediate masks to form a composition of a common pattern onto a test mask in a first projection apparatus;
      (c.3) determining a distribution of line widths of the formed structure elements of the common pattern on the test mask and comparing with predefined, nominal line widths so as to determine a distribution of deviations of the line widths;
      (c.4) predefining a function that specifies a line width depending upon a radiation dose used in the first projection apparatus;
      (c.5) calculating a distribution of corrections for the radiation dose from the predefined function and the measured distribution of deviations of the line widths so as to compensate for deviations of a projection;
      (c.6) determining a transmission at each location of the structure elements on the intermediate mask from the determined distribution of the corrections for the radiation dose; and
      (c.7) forming further structure elements that locally differently reduce the transmission at each location of the structure elements of the partial pattern on the front side of the intermediate mask, in a plane spaced apart from the front side of the intermediate mask, with a distribution dependent on the determined transmission at the location of the structure elements on the intermediate mask;
   d) providing the intermediate masks with the further structure elements arranged in the plane spaced apart from the front side of the intermediate masks in the first projection apparatus so as to provide an exposure of the production mask; and
   e) progressively projecting the intermediate masks onto the production mask to achieve a composition of the common pattern from the decomposed partial patterns on the production mask in the first projection apparatus.

2. The method of claim 1, wherein predetermined values are predefined for the deviations, and step c) further comprises:
   (c.8) progressively projecting the intermediate masks for the composition of the common pattern on a further test mask in the first projection apparatus;
   (c.9) determining a distribution of line widths of the formed structure elements of the common pattern on the further test mask, and comparing with the predefined, nominal line widths to determine a distribution of deviations of the line widths;
   (c.10) comparing the distribution of deviations with the predetermined values;
   (c.11) continuing to step (d) when the deviations are less than the predetermined values, and continuing to step (c.12) when the deviations are equal to or greater than the predetermined values;
   (c.12) calculating a distribution of corrections for the radiation dose from the predefined function and the measured distribution of deviations of the line widths so as to compensate for the deviations in a projection;
   (c.13) determining the transmission at each location of the structure elements on the further intermediate mask from the determined distribution of the corrections for the radiation dose;
   (c.14) forming further structure elements that locally differently reduce the transmission at each location of the structure elements of the partial pattern on the front side of the intermediate mask, in a plane spaced apart from the front side of the intermediate mask, with a distribution dependent on the determined transmission at the location of the structure elements on the intermediate mask; and
   (c.15) repeat at least steps (c.8) to (c.11).

3. The method of claim 1, wherein step of determining the distribution of line widths comprises a measurement of the structure elements formed on the test mask.

4. The method of claim 1, wherein step (c.3) of determining the distribution of line widths further comprises:
   providing the test mask in a second projection apparatus to expose a test wafer;
   lithographically projecting the pattern from the test mask onto the test wafer in the second projection apparatus;

measuring a distribution of line widths on the test wafer; and determining the distribution of line widths on the test mask from the measured distribution of line widths on the test wafer by predefinition of a further function that specifies the line width on the test wafer in dependence upon the line width on the test mask.

5. The method of claim 1, wherein the predefined, nominal line widths are derived from the pattern in the electronically stored format.

6. The method of claim 1, wherein, in step (e), the first projection apparatus comprises a mask stepper or scanner having an imaging that demagnifies the line widths of the structure elements of the pattern.

7. The method of claim 6, wherein a ratio of 2:1 is chosen for the demagnifying imaging.

8. The method of claim 1, wherein, in step (c.2), the first projection apparatus comprises a mask stepper or scanner having an imaging that demagnifies the line widths of the structure elements of the pattern.

9. The method of claim 1, wherein, the number of partial patterns in which the pattern is decomposed in step (b) is one of 4, 9 and 16, such that the same number of respective intermediate masks are produced in step (c).

10. The method of claim 1, wherein the intermediate masked are produced in step (c) in an electron beam writer.

11. The method of claim 1, wherein, in the step of predefining a function that specifies a line width depending upon a radiation dose used in the first projection apparatus of step (c.4), a further dependence of the line width of the structure elements based upon the density and periodicity of adjacent structure elements is predefined, and the further dependence is utilized in calculating the distribution of corrections of step (c.5).

12. The method of claim 1, wherein step (c) further comprises the formation of further structure elements in a plane that is spaced apart from the front side and that is located within a quartz substrate of the intermediate masks or at a rear side of a substrate surface of the intermediate masks.

13. The method of claim 12, wherein the further structure elements comprise shading elements formed by a pulsed laser in the quartz substrate of the intermediate masks.

14. The method of claim 13, comprising the following further steps:

assigning a respective partial region of the determined distribution of corrections for the radiation dose corresponding with the decomposed partial patterns to the intermediate masks;

providing the intermediate masks in a pulsed laser; and forming shading elements in the quartz substrates of the intermediate masks based upon the determined distribution of the correction for the radiation dose in the respectively assigned partial regions.

15. The method of claim 1, in which step (c) comprises the formation of further structure elements in a plane which is spaced apart from the front side and that is formed by a surface of separate optical elements respectively assigned to the intermediate masks.

16. The method of claim 15, wherein step (c) further comprises:

providing a respective optical element for each intermediate mask;

assigning a respective partial region of the determined distribution of corrections for the radiation dose in accordance with the decomposed partial patterns to the intermediate masks;

forming the structure elements on the surface of each optical element respectively assigned to each intermediate mask based upon the determined distribution of the correction for the radiation dose in the assigned partial region; and affixing each optical element to the intermediate mask respectively assigned to the optical element so as to perform the projection onto the product wafer.

* * * * *